(12) United States Patent
Park et al.

(10) Patent No.: US 8,835,201 B2
(45) Date of Patent: Sep. 16, 2014

(54) METHOD OF MANUFACTURING ORGANIC LIGHT EMITTING DIODE DISPLAY

(71) Applicants: Chang-Mo Park, Yongin (KR);
Dong-Min Lee, Yongin (KR);
Khachatryan Hayk, Yongin (KR)

(72) Inventors: Chang-Mo Park, Yongin (KR);
Dong-Min Lee, Yongin (KR);
Khachatryan Hayk, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/906,437

(22) Filed: May 31, 2013

(65) Prior Publication Data

US 2014/0120639 A1        May 1, 2014

(30) Foreign Application Priority Data

Oct. 29, 2012   (KR) .................. 10-2012-0120456

(51) Int. Cl.
*H01L 21/00*            (2006.01)
(52) U.S. Cl.
USPC ............................................ 438/29; 438/455

(58) Field of Classification Search
USPC ..................... 438/29, 455, 458; 455/24, 25
See application file for complete search history.

(56) References Cited

U.S. PATENT DOCUMENTS

| 2002/0192428 A1 | 12/2002 | Sol et al. | |
| 2013/0072079 A1* | 3/2013 | Tang et al. | 445/24 |
| 2013/0076268 A1* | 3/2013 | Choi et al. | 315/312 |

FOREIGN PATENT DOCUMENTS

| KR | 10-2006-0084237 A | 7/2006 |
| KR | 10-0981923 B1 | 9/2010 |
| KR | 10-2011-0059964 A | 6/2011 |

* cited by examiner

*Primary Examiner* — Reema Patel
(74) *Attorney, Agent, or Firm* — Lee & Morse, P.C.

(57) ABSTRACT

A method of manufacturing an organic light emitting diode (OLED) display, the method including forming a frit adhesive layer on an outer edge portion of a display substrate; forming a mold-releasing layer on a support substrate; attaching the frit adhesive layer of the display substrate on the mold-releasing layer of the support substrate; forming an organic light emitting member on the display substrate; and separating a display portion of the display substrate from the mold-releasing layer by cutting an outer edge portion of the display substrate.

9 Claims, 5 Drawing Sheets

METHOD OF MANUFACTURING ORGANIC LIGHT EMITTING DIODE DISPLAY

CROSS-REFERENCE TO RELATED APPLICATIONS

This application claims priority to and the benefit of Korean Patent Application No. 10-2012-0120456, filed in the Korean Intellectual Property Office on Oct. 29, 2012, the entire contents of which are incorporated herein by reference.

BACKGROUND

1. Field

The embodiments relate to a method of manufacturing an organic light emitting diode (OLED) display.

2. Description of the Related Art

An OLED display may include OLEDs that are formed with a hole injection electrode, an organic emission layer, and an electron injection electrode. Each OLED emits light by energy generated when excitons (that are formed by coupling of electrons and holes within the organic emission layer) drop from an exited state to a ground state.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a method of manufacturing an OLED display having advantages of easily fixing a display substrate to a support substrate and easily separating the display substrate from the support substrate.

An exemplary embodiment provides a method of manufacturing an OLED display, the method including: forming a frit adhesive layer on an outer edge portion of a display substrate; forming a mold-releasing layer on a support substrate; attaching the frit adhesive layer of the display substrate on the mold-releasing layer of the support substrate; forming an organic light emitting member on the display substrate; and separating a display portion of the display substrate from the mold-releasing layer by cutting the outer edge portion of the display substrate.

The forming of a frit adhesive layer may include forming a frit material on the outer edge portion of the display substrate; and baking the frit material.

The mold-releasing layer may include a mold-releasing material including talc.

The forming of a mold-releasing layer may include producing a mold-releasing material suspension by distributing the mold-releasing material in a solvent; coating the mold-releasing material suspension on the support substrate; and drying the mold-releasing material suspension.

A content of the mold-releasing material in the mold-releasing material suspension may be 5 wt % to 30 wt %.

The coating of the mold-releasing material suspension may be performed using any one coating device that is selected from a screen printer, a spray gun, and a slit coater.

At the attaching of the frit adhesive layer, the display portion of the display substrate may contact with the mold-releasing layer of the support substrate.

The display substrate may be a glass substrate, and the glass substrate may have a thickness of 40 μm to 130 μm.

In a method of manufacturing an OLED display according to an exemplary embodiment, by attaching a frit adhesive layer of a display substrate on a mold-releasing layer of a support substrate and completely fixing the display substrate to the support substrate, when forming an organic light emitting member on the display substrate, a wrinkle can be prevented from occurring in the display substrate.

Further, by forming a mold-releasing layer by coating a mold-releasing material including talc on the support substrate, separate sputtering and photo processes for forming the mold-releasing layer can be omitted.

Further, by forming a frit adhesive layer in the display substrate and attaching the display substrate to the support substrate, the display substrate is completely fixed to the support substrate and thus a precompaction processing of a separate display substrate is unnecessary, and an area of the display substrate that is attached to the support substrate can be minimized and thus a process margin can be increased.

DETAILED DESCRIPTION

Figure 1:
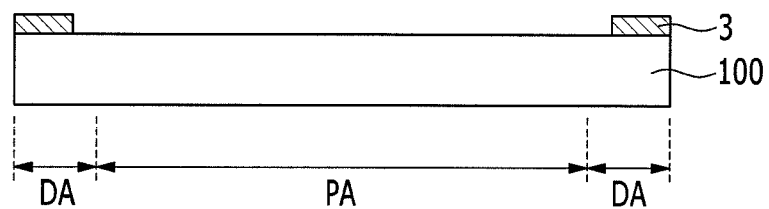
FIG. 1 illustrates a cross-sectional view of a stage in a method of manufacturing an OLED display according to an exemplary embodiment and illustrates a step of forming a frit adhesive layer under a display substrate.

The embodiments will be described more fully hereinafter with reference to the accompanying drawings, in which exemplary embodiments are shown. As those skilled in the art would realize, the described embodiments may be modified in various different ways, all without departing from the spirit or scope.

The drawings and description are to be regarded as illustrative in nature and not restrictive. Like reference numerals designate like elements throughout the specification.

Further, in the drawings, a size and thickness of each element are randomly represented for better understanding and ease of description, and the present invention is not limited thereto.

In the drawings, the thickness of layers, films, panels, regions, etc., are exaggerated for clarity. In the drawings, for better understanding and ease of description, thicknesses of some layers and areas are excessively displayed. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

Further, in the specification, it means that an upper part of a target portion indicates an upper part or a lower part of a target portion, and it does not mean that the target portion is always positioned at the upper side based on a gravity direction.

Hereinafter, a method of manufacturing an OLED display according to an exemplary embodiment will be described in detail with reference to FIGS. 1 to 6.

Figure 2:
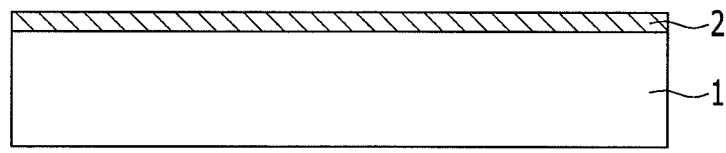
FIG. 2 illustrates a cross-sectional view of a stage in a method of manufacturing an OLED display according to an exemplary embodiment and illustrates a step of forming a mold-releasing layer on a support substrate.
Figure 3:
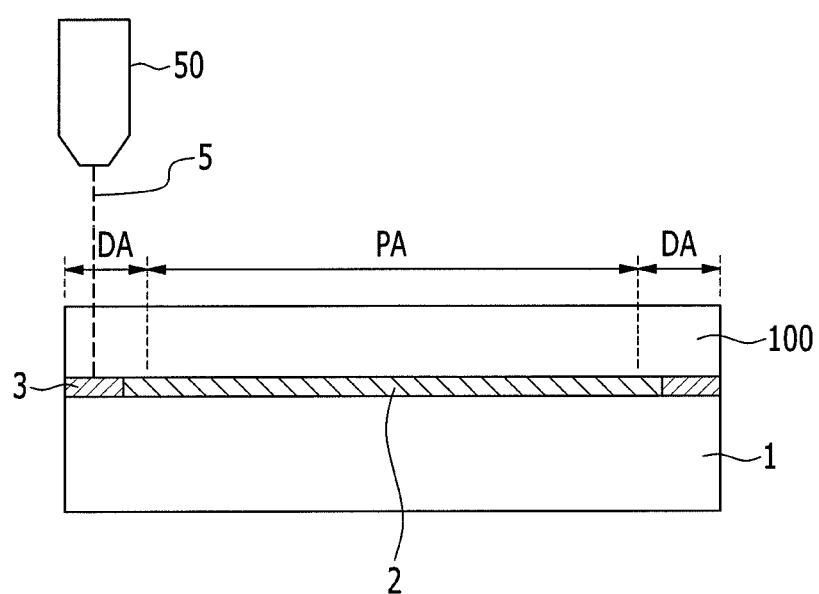
FIG. 3 illustrates a diagram of a step of cohering the display substrate of FIG. 1 and the support substrate of FIG. 2.
Figure 4:
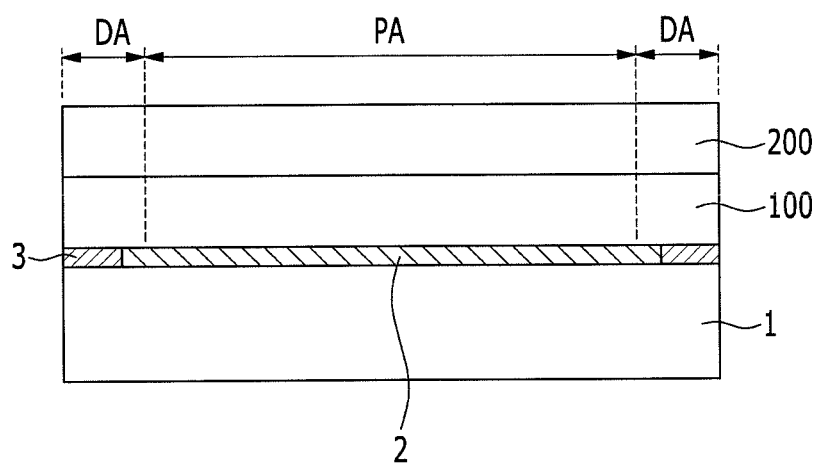
FIG. 4 illustrates a diagram of a step of forming an organic light emitting display element on the display substrate of FIG. 3.
Figure 5:
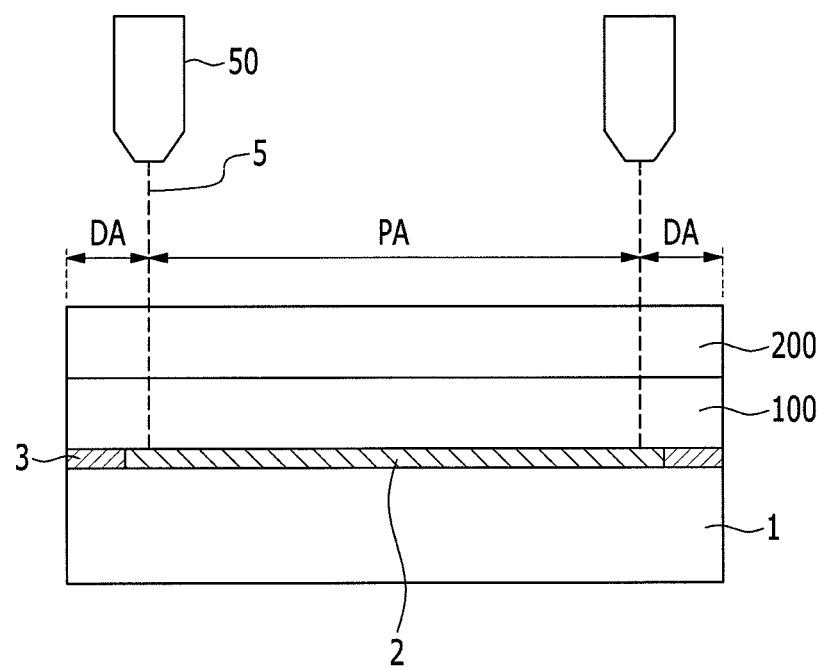
FIG. 5 illustrates a diagram of step of radiating a laser beam to a peripheral cutting portion of the display substrate of FIG. 4.
Figure 6:
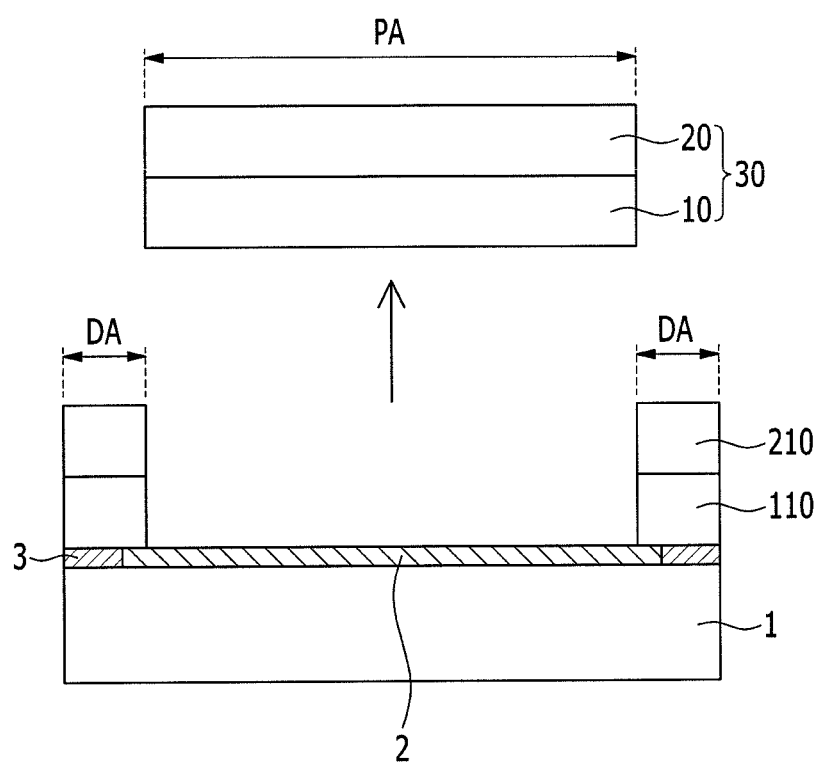
FIG. 6 illustrates a diagram of step of separating the display substrate and the OLED of FIG. 5 from the support substrate.

FIGS. 1 to 6 illustrate views sequentially showing stages in a method of manufacturing an OLED display according to an exemplary embodiment. FIG. 1 illustrates a cross-sectional view of a step of forming a frit adhesive layer under a display substrate, FIG. 2 illustrates a cross-sectional view of a step of forming a mold-releasing layer on a support substrate, FIG. 3 illustrates a diagram showing a step of cohering the display substrate of FIG. 1 and the support substrate of FIG. 2, FIG. 4 illustrates a diagram showing a step of forming an organic light emitting display element on the display substrate of FIG. 3, FIG. 5 illustrates a diagram showing a step of radiation a laser beam to a peripheral cutting portion of the display substrate of FIG. 4, and FIG. 6 illustrates a diagram showing a step of separating the display substrate and the OLED of FIG. 5 from the support substrate.

First, as shown in FIG. 1, a frit adhesive layer 3 may be formed on an outer edge portion DA of a display substrate 100. For example, a frit material for forming the frit adhesive layer 3 may be applied on the outer edge portion DA of the display substrate 100 that is formed with a glass substrate having a thickness of about 40 µm to about 130 µm.

In an implementation, the frit material may be formed along a line (using a screen printer) in the outer edge portion DA of the display substrate 100, which is an outer edge portion further than a position at which an organic light emitting member 200 is to be formed. The outer edge portion DA of the display substrate 100 may be a portion that is cut and removed in a subsequent process.

By baking and curing the frit material, the frit adhesive layer 3 may be formed. Because a solvent within the frit material should be removed, a baking process may be performed for about 1 hour at a temperature of about 350° C.

Next, as shown in FIG. 2, a mold-releasing layer 2 may be formed on a support substrate 1. The support substrate 1 may help prevent the display substrate 100 from being bent due to a thin thickness of the display substrate 100 in which the organic light emitting member 200 is to be formed and may support the display substrate 100. The support substrate 1 may include at least one material selected from polyethylene terephthalate (PET), polyethylene naphthalate (PEN), polyethylene sulfide (PES), and polyethylene (PE).

For example, by distributing the mold-releasing material in a solvent, a mold-releasing material suspension may be produced. The mold-releasing material may include, e.g., talc ($H_2Mg_3(SiO_3)_4$ and $Mg_3Si_4O_{10}(OH)_2$. The solvent may be a material that distributes a mold-releasing material, e.g., deionized water and alcohol. The mold-releasing material may be included in the mold-releasing material suspension in an amount of about 5 wt % to about 30 wt %, based on a total weight of the mold-releasing material suspension.

The mold-releasing material suspension may be coated on the support substrate using a coating device selected from a screen printer, a spray gun, and a slit coater.

By drying the mold-releasing material suspension, the mold-releasing layer 2 may be formed. In a mold-releasing material suspension using deionized water as a solvent, a dry condition to dry the mold-releasing material suspension may include drying for 5 minutes at a temperature of 130° C.

Next, as shown in FIG. 3, the display substrate 100 may be inverted, and the frit adhesive layer 3 of the display substrate 100 may be attached on the mold-releasing layer 2 of the support substrate 1. In this case, a display portion PA of the display substrate 100 may contact the mold-releasing layer 2 of the support substrate 1. In this case, by radiating a laser beam 5 (that is generated in a laser generating device 50) to the frit adhesive layer 3 and instantaneously melting and condensing the frit adhesive layer 3, the display substrate 100 and the support substrate 1 may be attached.

Next, as shown in FIG. 4, the organic light emitting member 200 may be formed on the display substrate 100. The organic light emitting member 200 may include an OLED that is formed on the display substrate 100 and an encapsulation member that covers the OLED. For example, the OLED may include a plurality of signal lines and a pixel that is connected thereto, and a pixel may include a thin film transistor including a switching transistor and a driving transistor, a storage capacitor, and an organic emission layer.

Next, as shown in FIG. 5, in order to separate the outer edge portion DA and the display portion PA of the display substrate 100, the laser beam 5 may be radiated to a boundary line of the outer edge portion DA and the display portion PA using the laser beam generating device 50. In this case, the outer edge portion DA of the organic light emitting member 200 may be together cut. A device for separating the outer edge portion DA and the display portion PA of the display substrate 100 is not limited to the radiation beam generating device 50 and may include, e.g., a diamond wheel.

Next, as shown in FIG. 6, a display member 30 including a display portion 10 of the display substrate 100 (that is cut from an outer edge portion 110 of the display substrate 100) and a display portion 20 of the organic light emitting member 200 (that is cut from an outer edge portion 210 of the organic light emitting member 200) may be separated from the mold-releasing layer 2. In this case, the display portion 10 and the support substrate 1 may be easily separated from each other because the mold-releasing layer 2 may be formed between the display portion 10 of the display substrate 100 and the support substrate 1.

By way of summation and review, in order to ensure that an OLED display is thin, a display substrate may be a thin glass substrate. In this case, in order to prevent bending of the thin glass substrate in a production process, a support substrate (that supports the glass substrate) may be used.

After the display substrate is attached to the support substrate, in a subsequent process, in order to separate the display substrate from the support substrate (when aluminum zinc oxide (AZO) is used as a mold-releasing layer), separate sputtering and photo processes for forming AZO may be necessary.

Further, for stability of a production process, a process margin may be insufficient because a width of an attached portion of the support substrate and the display substrate may be wide.

Further, when a pre-compaction processing is not performed in the thin glass substrate, a burst failure or a wrinkle phenomenon may occur due to a thermal expansion coefficient difference between the glass substrate and the support substrate.

Thus, by attaching the frit adhesive layer 3 of the display substrate 100 on the mold-releasing layer 2 of the support substrate 1, a wrinkle of the display substrate 100 that may otherwise occur in a process of forming the organic light emitting member 200 on the display substrate 100 by completely fixing the display substrate 100 to the support substrate 1 may be prevented.

Further, by forming the mold-releasing layer 2 by coating the mold-releasing material including talc on the support substrate 1, separate sputtering and photo processes for forming the mold-releasing layer 2 may be omitted.

Further, by forming the frit adhesive layer 3 in the display substrate 100, the display substrate 100 may be attached to the support substrate 1. Thus, the display substrate 100 may be completely fixed to the support substrate 1, and a separate pre-compaction processing of the display substrate 100 may thus be unnecessary, an area of the display substrate 100 that is attached to the support substrate 1 may be minimized, and a process margin may thus be increased.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
| --- | --- |
| 1: support substrate | 2: mold-releasing layer |
| 3: frit adhesive layer | 10: display portion of display substrate |
| 20: display portion of organic light emitting member | |
| 100: display substrate | |
| 200: organic light emitting member | |

What is claimed is:

1. A method of manufacturing an organic light emitting diode (OLED) display, the method comprising:
    forming a frit adhesive layer on an outer edge portion of a display substrate;
    forming a mold-releasing layer on a support substrate;
    attaching the frit adhesive layer of the display substrate on the mold-releasing layer of the support substrate;
    forming an organic light emitting member on the display substrate; and
    separating a display portion of the display substrate from the mold-releasing layer by cutting an outer edge portion of the display substrate.

2. The method of claim 1, wherein forming the frit adhesive layer includes:
    forming a frit material on the outer edge portion of the display substrate, and
    baking the frit material.

3. The method of claim 1, wherein the mold-releasing layer includes a mold-releasing material, the mold-releasing material including talc.

4. The method of claim 3, wherein forming the mold-releasing layer includes:
    producing a mold-releasing material suspension by distributing the mold-releasing material in a solvent,
    coating the mold-releasing material suspension on the support substrate, and
    drying the mold-releasing material suspension.

5. The method of claim 4, wherein the mold-releasing material is included in the mold-releasing material suspension in an amount of about 5 wt % to about 30 wt %, based on a total weight of the mold-releasing material suspension.

6. The method of claim 4, wherein coating the mold-releasing material suspension includes coating with a coating device, the coating device including a screen printer, a spray gun, or a slit coater.

7. The method of claim 1, wherein attaching the frit adhesive layer on the mold-releasing layer of the support substrate includes bringing the display portion of the display substrate into contact with the mold-releasing layer of the support substrate.

8. The method of claim 1, wherein the display substrate is a glass substrate.

9. The method of claim 8, wherein the glass substrate has a thickness of about 40 μm to about 130 μm.

* * * * *